(12) United States Patent
Richard et al.

(10) Patent No.: US 9,958,830 B2
(45) Date of Patent: May 1, 2018

(54) FUNCTIONAL MICROMECHANICAL ASSEMBLY

(75) Inventors: David Richard, Yverdon-les-Bains (CH); Stewes Bourban, Cudrefin (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days. days.

(21) Appl. No.: 14/233,303

(22) PCT Filed: Jul. 17, 2012

(86) PCT No.: PCT/EP2012/064017
§ 371 (c)(1),
(2), (4) Date: Jan. 16, 2014

(87) PCT Pub. No.: WO2013/011032
PCT Pub. Date: Jan. 24, 2013

(65) Prior Publication Data
US 2014/0160900 A1      Jun. 12, 2014

(30) Foreign Application Priority Data

Jul. 21, 2011   (EP) .................................... 11005979
Oct. 14, 2011   (EP) .................................... 11185240

(51) Int. Cl.
*G04B 13/02*         (2006.01)
*G04B 31/08*         (2006.01)
(Continued)

(52) U.S. Cl.
CPC .......... *G04B 13/02* (2013.01); *B81C 99/0095* (2013.01); *G04B 1/14* (2013.01);
(Continued)

(58) Field of Classification Search
CPC ................................ G04B 15/14; G04B 31/08
(Continued)

(56) References Cited

U.S. PATENT DOCUMENTS 5,252,294 A * 10/1993 Kroy .................... B01J 19/0093
                                              257/E27.006
5,803,967 A *  9/1998 Plano et al. .................. 117/102
(Continued)

FOREIGN PATENT DOCUMENTS

BE     WO 9859089 A1 * 12/1998   ......... C23C 16/0236
CH         702576 A2 *  7/2011   ............. G04B 15/14
(Continued)

OTHER PUBLICATIONS

Schade et al., Tribological behaviour of <100> and <111> fibre textured CVD diamond films under dry planar sliding contact, Feb. 17, 2006, Diamond & Related Materials, Science Direct.*
(Continued)

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A functional micromechanical timepiece assembly including at least a first component, including a first layer defining a first contact surface configured to come into friction contact with a second contact surface defined by a second layer, the second layer belonging, either to the first component, or to at least a second micromechanical component forming the assembly with the first component. The first and second layers each include carbon with at least 50% carbon atoms and, on the first and second contact surfaces, the layers have different surface crystalline plane orientations from each other.

18 Claims, 2 Drawing Sheets

(51) Int. Cl.
*G04B 1/14* (2006.01)
*G04B 15/14* (2006.01)
*G04B 31/00* (2006.01)
*G04B 31/004* (2006.01)
*B81C 99/00* (2010.01)
*C23C 16/27* (2006.01)
*C23C 16/26* (2006.01)

(52) U.S. Cl.
CPC ........... *G04B 1/145* (2013.01); *G04B 13/022* (2013.01); *G04B 15/14* (2013.01); *G04B 31/004* (2013.01); *G04B 31/08* (2013.01); *B81B 2201/035* (2013.01); *C10M 2201/041* (2013.01); *C23C 16/26* (2013.01); *C23C 16/27* (2013.01)

(58) Field of Classification Search
USPC .......................................... 368/124, 140, 324
See application file for complete search history.

(56) References Cited

U.S. PATENT DOCUMENTS

| | | | |
|---|---|---|---|
| H1792 H | | 4/1999 | Moran et al. |
| 6,472,062 B1* | | 10/2002 | Neerinck ............ C23C 16/0236 427/249.11 |
| 6,615,496 B1* | | 9/2003 | Fleming et al. ................. 30/350 |
| 8,167,481 B2* | | 5/2012 | Takeuchi et al. ............. 368/324 |
| 8,514,669 B2* | | 8/2013 | Marechal et al. ............ 368/243 |
| 2002/0114225 A1* | | 8/2002 | Damasko ...................... 368/125 |
| 2002/0191493 A1* | | 12/2002 | Hara .............................. 368/140 |
| 2004/0119354 A1* | | 6/2004 | Takada et al. ................. 310/90 |
| 2006/0216515 A1* | | 9/2006 | Kazahaya et al. ............ 428/408 |
| 2007/0231564 A1* | | 10/2007 | Ochi ....................... C23C 24/06 428/323 |
| 2009/0186783 A1* | | 7/2009 | Martin et al. .................. 508/100 |
| 2009/0201774 A1* | | 8/2009 | Fujimori et al. .............. 368/320 |
| 2012/0051192 A1* | | 3/2012 | Steinmuller ............ C23C 16/26 368/127 |
| 2012/0263909 A1* | | 10/2012 | Gluche ................. B81B 3/0075 428/76 |
| 2013/0170330 A1* | | 7/2013 | Hessler et al. ................. 368/324 |
| 2013/0234165 A1* | | 9/2013 | Bourban et al. ................. 257/77 |
| 2013/0260097 A1* | | 10/2013 | Takada ...................... B32B 5/16 428/143 |
| 2014/0245987 A1* | | 9/2014 | Da Rocha Mordente ........... C23C 14/0641 123/198 R |

FOREIGN PATENT DOCUMENTS

| | | |
|---|---|---|
| EP | 1 649 955 | 4/2006 |
| EP | 2 107 434 | 10/2009 |
| EP | 2 236 455 | 10/2010 |

OTHER PUBLICATIONS

Schade, A. et al., "Tribological behavior of<100> and <111> fibre textured CVD diamond films under dry planar sliding contact", Diamond & Related Materials, vol. 15, No. 10, pp. 1682-1688, (Oct. 1, 2006) XP028000726.

Cappelli, E. et al., "Diamond nucleation and growth on different cutting tool materials: influence of substrate pre-treatments" Diamond and Related Materials, vol. 5, No. 3-5, pp. 292-298, (Apr. 1, 1996) XP005309764.

International Search Report dated Nov. 5, 2012 in PCT/EP12/064017 Filed Jul. 17, 2012.

\* cited by examiner

FUNCTIONAL MICROMECHANICAL ASSEMBLY

FIELD OF THE INVENTION

The present invention concerns a functional micromechanical timepiece assembly including a first component comprising a first layer defining a first contact surface intended to come into friction contact with a second contact surface defined by a second layer, said second layer belonging either to said first component, or to at least a second micromechanical component forming said assembly with said first component. The invention more particularly concerns a pair of micromechanical timepiece components which cooperate mechanically with each other, such as an escape wheel and pallet stones.

PRIOR ART

Recent mechanical timepiece movement structures with a diamond-coated silicon escapement (pallet stones and escape wheel) and with no intentional liquid lubrication of the pallet stone/escape wheel contact do not function in a satisfactory manner. Indeed, the regulating power of this type of non-lubricated escapement is inferior to that of escapement devices having conventional lubrication. The Applicant observed in certain cases that the non-lubricated escapement stopped operating after a few hours following irreversible deterioration in the tribological performance of the escapement coatings.

The only apparently effective approach to non-lubricated diamond-coated escapements consists in pre-polishing the diamond friction surfaces prior to assembling them in the timepiece movement. However, this is laborious and incompatible with the requirement for industrial production at an acceptable cost price.

In micromechanical applications, most of the diamond layers used are nanocrystalline in nature (grain size <50 nm, Ra<50 nm) since those skilled in the art intuitively believe that smoother surfaces will glide better over each other.

It is a main object of the present invention to provide a tribological solution permitting micromechanical components to rub against each other without lubrication in a reliable and durable manner, particularly in timepiece applications, and which overcomes at least the aforementioned drawbacks of the prior art.

It is also an object of the invention to provide a functional micromechanical assembly, in particular for a timepiece, including moving elements with improved tribological features which do not require post treatment steps such as polishing.

SUMMARY OF THE INVENTION

The invention therefore concerns a functional micromechanical timepiece assembly including a first component defining a first contact surface intended to come into friction contact with a second contact surface defined by a second layer, said second layer either belonging to said first component or to at least a second micromechanical component forming said assembly with said first component, said assembly being characterized in that the first and second layers are each formed of carbon with at least 50% carbon atoms, and in that, at least at the first and second contact surfaces, said layers have different surface crystalline plane orientations from each other.

As a result of this arrangement, it is possible for a pair of micromechanical components, such as, for example, the pallet stones/escape wheel of a timepiece movement, to function with no lubrication. The Applicant observed that the tribological performance of this type of functional assembly in this application is as good as or better than that of state-of-the-art escapements with liquid lubrication.

The first and second layers of said micromechanical component(s) arranged in this configuration have greater wear resistance. Further, energy losses caused by friction between two contact surfaces of the layers are greatly reduced, and the functional micromechanical assembly therefore has improved tribological features compared to pairs of opposing friction surfaces of the same structure. Interlocking, which occurs when surfaces having identical structure are rubbed together, is eliminated by the arrangement of the present invention. According to an advantageous embodiment of the invention, at least said first layer has a microcrystalline structure, at least on the contact surface thereof, and preferably said first and second layers each have a microcrystalline structure, at least on the contact surface thereof. Typically, the grain size of said first and/or second layers is greater than 200 nm and less than 10 micrometres at least at their respective contact surfaces.

According to a preferred variant of this embodiment, the crystalline planes of said first and/or second layers each have, at least at their respective contact surfaces, different orientations in predetermined directions, and for example involving direction [100] of the family of directions <100> or direction [111] of the family of directions <111>.

Preferably, one of the crystalline planes of the family of crystalline planes {100} of said first layer will be associated, at least on the first contact surface, with one of the crystalline planes of the family of crystalline planes {111} of said second layer, at least on the second contact surface.

According to an advantageous feature, the mean angle defined by the normals to the crystalline planes (100) of the family {100} and (111) of the family {111} of the layers, at least on their respective contact surfaces, is comprised between 10° and 70°, preferably between 40° and 50°, and more preferably 45°.

According to an advantageous embodiment, the first component is made of solid single or polycrystalline diamond.

Preferably, the mean roughness (Rms) of one of the first or second contact surfaces is comprised between 80 nm and 3 micrometres. The mean roughness of the other first or second contact surface is lower and preferably at least one and a half times lower, typically comprised between 50 nm and 2 micrometres.

According to a variant embodiment of the invention, said first and/or second friction layer defining said first contact surface and/or said second contact surface covers a first and/or a second substrate to form said first and/or said second component. Typically, the first and/or second substrate may be made of silicon, or steel or ceramic, with or without an intermediate layer of chromium, titanium, nickel etc. In the case of a silicon substrate, the silicon may be silicon nitride, carbide, oxide or crude silicon.

According to another variant, the first and/or second components are made of solid single or polycrystalline diamond, thus directly defining the first and/or second contact surfaces. Whether said first and/or second layer are deposited on a substrate or solid, the thickness of these layers is at least greater than 150 nm. For solid components, the thickness of the first layer can be up to 1 mm. For components with a substrate, the first and/or second deposited layer may be up to 50 micrometres in thickness.

The function micromechanical assembly of the present invention finds advantageous applications within the field of horology. In particular, the first component may be a pallet stone and the second component an escape wheel or vice versa. In another timepiece application, the first component may be a wheel set arbour and the second component a bearing, or vice versa. According to another application within this domain, the first and second components may be gear wheel toothings. In a pair of elements of this type, the contact surfaces of the components in friction contact do not experience irreversible deterioration of their tribological performance and exhibit good stability. It is possible for a moving timepiece system, such as a Swiss lever escapement, to function with no lubrication of the pallet stone/escape wheel contact providing at least equivalent performance to standard references. The friction layers (which may be solid or on a substrate) of the present invention, particularly diamond layers, are immediately effective, with no post treatment required to modify the nature of the friction surfaces (for example by polishing, surface finishing, etc.). In a timepiece application involving only one component according to the invention, the component may be a mainspring formed of a strip, a front face of said strip forming said first contact surface, and the back face of said strip forming said second contact surface. It goes without saying that in particular applications of the functional micromechanical assembly of the invention, a component may come into friction contact with two or more other components. In that case, the friction surfaces of the components coming into contact with each other will have different crystalline plane orientations from each other in accordance with the invention.

The layers of the present invention are advantageously formed using hot filament CVD technology or microwave technology. The diamond may also be solid, and may or may not be derived from a growth. The desired crystalline plane orientations (for example (100) and (111)) are obtained by varying the proportions of reactive gases in the deposition chamber and the pressure and temperature parameters, as disclosed, for example, in the publication by Y. Avigal et al entitled "[100]—Textured diamond films for tribological applications" published by Elsevier in Diamond and Related Materials, vol. 6, 1997, pages 381-385 particularly section 3.1, in the publication by Qijin Chen et al entitled "Oriented and textured growth of (111) diamond on silicon using hot filament chemical vapour deposition" published by Elsevier in Thin Solid Films vol. 274 1996, pages 160-164 and in the publication by M. Grujjicic and S. G. Lai published in the Journal of Materials Synthesis and Processing, Vol. No. 2, 200 pages 73-85, the documents being incorporated herein by reference.

DESCRIPTION OF THE DRAWINGS

Other features and advantages of the functional micromechanical assembly according to the invention will also appear from the following detailed description of embodiments of this assembly, this description being made with reference to the annexed drawings, given by way of non-limiting example and in which.

DETAILED DESCRIPTION OF THE INVENTION

Figure 1:
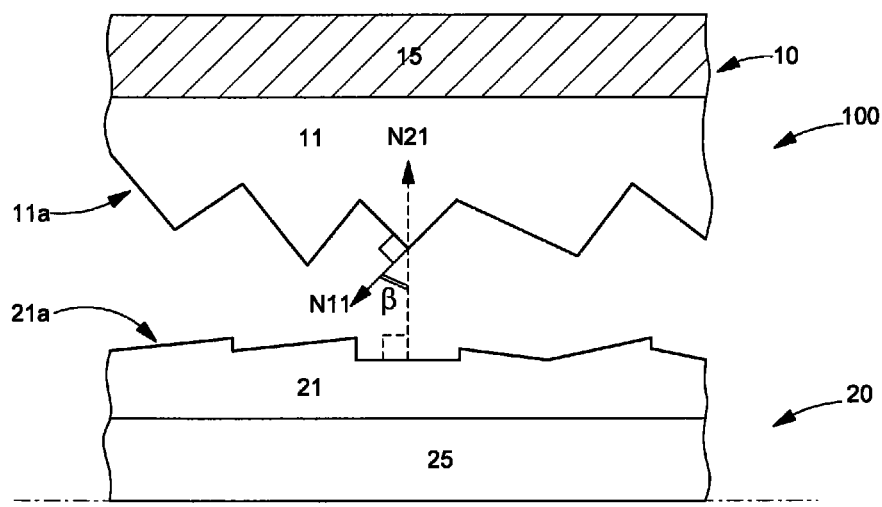
FIG. 1 is a schematic enlarged diagram of an example of two contact surfaces of two micromechanical components forming a functional micromechanical assembly and respectively having crystalline plane orientations (111) and (100) in accordance with the invention.

FIG. 1 shows an example embodiment of a pair of micromechanical components 10 and 20 according to the invention. The first component 10 includes a substrate 15 on which there is deposited a diamond layer 11 having a contact surface 11a intended to come into friction contact with a second contact surface 21a defined by a second layer 21. At contact surface 11a, layer 11 has crystalline planes oriented in a predetermined direction, namely direction [111]. At least on contact surface 11a, layer 11 is microcrystalline, with grain sizes greater than 200 nm and a roughness Rms greater than 80 nm.

Micromechanical component 20 includes a substrate 25 on which there is deposited a diamond layer 21 having a contact surface 21a opposite to surface 11a of micromechanical component 10. Layers 11 and 21 thus form friction layers.

At least on contact surface 21a, layer 21 has crystalline planes oriented in a predetermined direction, namely direction [100]. In practice, these crystalline planes are substantially inclined relative to the friction direction F due to inevitable growth defects specific to the conventional method of obtaining layer 21. At least on contact surface 21a, layer 21 is microcrystalline, and has grain sizes greater than 200 nm.

At least on the contact surfaces 11a and 21a intended to come into friction contact with each other, layers 11 and 21 thus have different crystalline plane orientations and in this example, these two orientations are in directions [100] and [111]. Referring to FIG. 1, it is seen that it is also possible to define the difference in crystalline plane orientation of surfaces 11a and 21a by angle β which is the mean angle formed by the normals N11 and N21 to the crystalline planes of contact surfaces 11a and 21a. β is comprised between 10° and 70°, preferably between 40° and 50° and more preferably equal to 45°. The angle $\beta_{moy}$ corresponds to the mean angular difference in crystalline orientations β of the two contact surfaces 11a and 21a. This angle can easily be calculated by those skilled in the art of diamonds since this is an important criterion in controlling the diamond deposition method.

FIG. 2 again shows the micromechanical component 20 in isolation, in order to illustrate the angle of tilt α. This angle is measured between the local normal to surface 21a on one hand, and on the other hand to the normal NF to the theoretical friction plane PF (in dotted lines in the Figure) which is defined by friction direction F and a straight line G appertaining to the theoretical surface defining surface 21a.

Angle α is calculated relative to the theoretical friction plane PF. It represents the mean of angles $\alpha_i$ between normal N25 and the normal to the planes (100) N21 in FIG. 2. Angle $\alpha_{moy}$ is preferably smaller than 30°, and more preferably smaller than 10°.

Typically, layers 11 and 21 have a thickness of at least 150 nm and preferably around 2.5 micrometres in order to obtain homogeneous crystalline plane orientations.

More generally, layers 11 and 21 defining surfaces 11a and 21a each include carbon with at least 50% carbon atoms. For example, these layers may be formed of diamond, Diamond Like Carbon, graphite or a combination of these materials.

According to a variant embodiment not shown, surfaces 11a and/or 21a are at least partially coated with a layer of coating of a different material from that forming layers 11 and/or 21. These coating layers could, for example, be formed of a gold, nickel or titanium film. These coating layers should preferably not have a thickness of more than 100 nm. In that case, the superficial texture of the first and second contact surfaces advantageously has different surface crystalline plane orientations in accordance with the invention.

Layers 11 and 21 of micromechanical components 10 and 21 can be deposited on substrates made of any type of material suitable for the deposition of a diamond, DLC or graphite layer. For example, substrates 15 and 25 could be chosen from among the group of materials including ceramics, silicon, deoxidised silicon, oxidised silicon, nitrided silicon, carbureted silicon and steels.

It is also possible to envisage making contact surfaces 11a and 21a of the invention without using a substrate for one and/or the other of the micromechanical components. Indeed, surfaces 11a and/or 21a may, according to a variant of the invention, be derived from solid single crystal or polycrystalline diamond.

Figure 2:
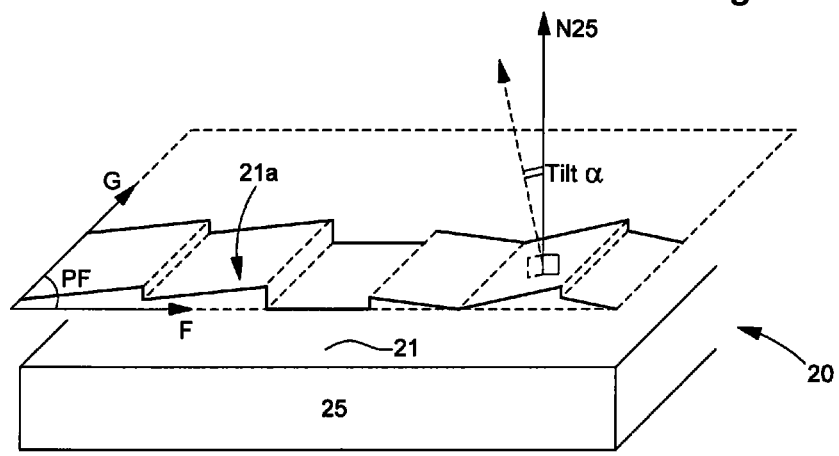
FIG. 2 is a schematic enlarged diagram of the contact surface of one of the micromechanical components of FIG. 1, which has an orientation in direction [100] and illustrating the angle of tilt of each of the crystalline planes (100).
Figure 3:
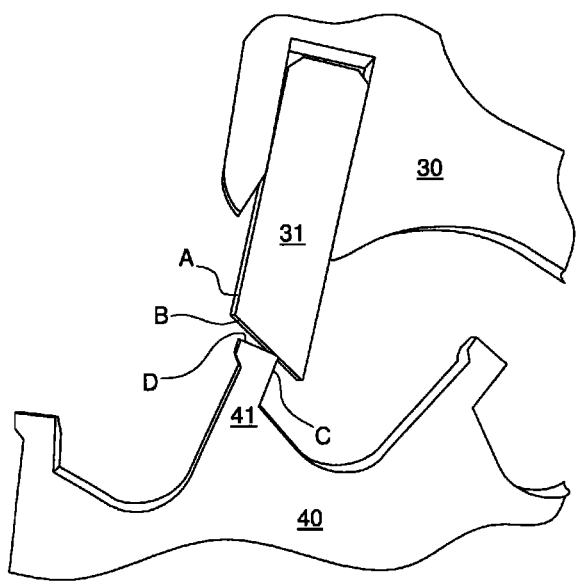
FIG. 3 is a partial side view of a pallet stone having a locking plane A and an impulse plane B cooperating with the locking plane C and impulse plane D of an escape wheel, planes A and B defining the first contact surface and planes C and D define the second contact surface according to the invention.

FIG. 3 shows an example application of the invention to producing a timepiece escapement in which a pallet lever 30 includes a pallet stone 31 which cooperates with a tooth 41 of an escape wheel 40. Pallet stone 31 has a locking plane A and an impulse plane B which cooperate with the locking plane C and impulse plane D of tooth 41. Locking plane A and impulse plane B have, for example, a contact surface conforming to surface 11a and planes C and D then having a contact surface conforming to surface 21a respectively described with reference to FIGS. 1 and 2. These planes A, B, C, D are highly stressed areas subject to high levels of friction and/or contact. According to a variant, pallet lever 30 may be integral with pallet stone 31.

Figure 4:
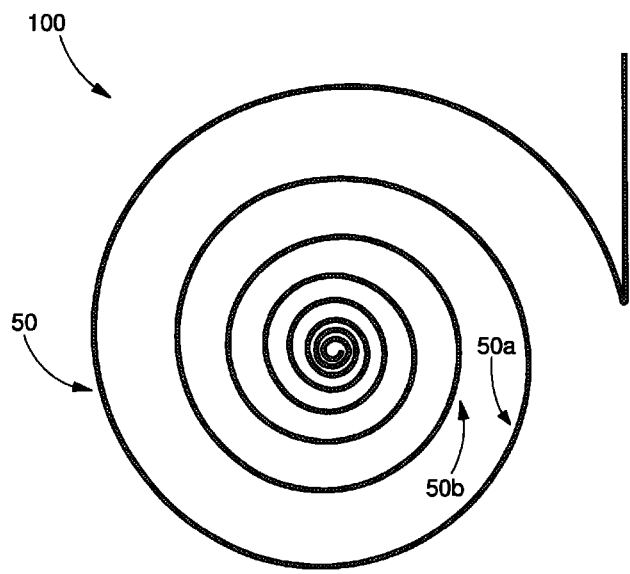
FIG. 4 is a top view of a mainspring strip having a front face and a back face respectively defining the first and second contact surfaces according to the invention.

FIG. 4 shows another timepiece application of the invention wherein a mainspring strip 50 has a front face 50a and a back face 50b which respectively conform to contact surfaces 11a and 21 described with reference to FIGS. 1 and 2.

Nonetheless, it is clear for those skilled in the art that the invention may be extended to other embodiments (not shown) wherein, for example, micromechanical components 10 and 11 are formed of a wheel set arbour such as a pivot and a bearing such as a jewel or a pair of gear wheel toothings, or any other pair of elements highly exposed to intense mechanical stresses which may or may not be of a tribological nature.

The reference signs in the claims are in no way limiting. The verbs "include" and "comprise" do not exclude the presence of different elements from those listed in the claims. The word "a" preceding an element does not exclude the presence of a plurality of such elements.

The invention claimed is:

1. A functional micromechanical timepiece assembly comprising:
    at least a first component including at least a first face, the at least first face being coated with a first layer defining a first contact surface configured to come into friction contact with a second contact surface defined by a second layer coating at least a second face, either of the first component or at least a second micromechanical timepiece component forming the assembly with the first component,
    wherein the first and second layers each include carbon with at least 50% carbon atoms, the first contact surface has a first determined crystalline plane orientation, the second contact surface has a second determined crystalline plane orientation, and the first and second determined orientations are different from each other, and
    wherein, at least on the first contact surface, crystalline planes of the first layer belong to a family of planes {111}, at least on the second contact surface, crystalline planes of the second layer belong to a family of planes {100}, a mean direction of the crystalline planes of the first layer belonging to the family of planes {111} and a mean direction of the crystalline planes of the second layer belonging to the family of planes {100} form a first angle between 10° and 70°.

2. The functional micromechanical timepiece assembly according to claim 1, wherein at least the first layer has a microcrystalline structure at least on the first contact surface.

3. The functional micromechanical timepiece assembly according to claim 2, wherein the first and second layers each have a microcrystalline structure at least on the respective contact surfaces thereof.

4. The functional micromechanical timepiece assembly according to claim 1, wherein grain size of at least the first layer is greater than 200 nm, at least on the first contact surface.

5. The functional micromechanical timepiece assembly according to claim 1, wherein grain size of the first and second layers is greater than 200 nm, at least at the respective contact surfaces thereof.

6. The functional micromechanical timepiece assembly according to claim 1, wherein the second layer belongs to the second component and the first and/or second component are made of solid single crystal or polycrystalline diamond.

7. The functional micromechanical timepiece assembly according to claim 1, wherein mean roughness of one of the first or second contact surfaces is greater than 80 nm.

8. The functional micromechanical timepiece assembly according to claim 1, wherein the first layer defining the first contact surface coats a first substrate to form the first component.

9. The functional micromechanical timepiece assembly according to claim 8, wherein at least one of the first layer and the second layer is formed of silicon or steel or ceramic.

10. The functional micromechanical timepiece assembly according to claim 8, wherein at least one of the first layer and the second layer has a thickness of at least 150 nm.

11. The functional micromechanical timepiece assembly according to claim 1, wherein the second layer belongs to the second component and the second layer defining the second contact surface coats a second substrate to form the second component.

12. The functional micromechanical timepiece assembly according to claim 1, wherein the second layer belongs to the second component and the first component is a pallet stone and the second component is an escape wheel or vice versa.

13. The functional micromechanical timepiece assembly according to claim 1, wherein the second layer belongs to the first component and the first component is a mainspring formed of a strip and a front face of the strip forms the first contact surface, and a back face of the strip forms the second contact surface.

14. The functional micromechanical timepiece assembly according to claim 1, wherein a lubricant is not included between the first component and the second component.

15. The functional micromechanical timepiece assembly according to claim 1, wherein the first face is not polished after being coated with the first layer and the second face is not polished after being coated with the second layer.

16. The functional micromechanical timepiece assembly according to claim 1, wherein the first angle is 45°.

17. The functional micromechanical timepiece assembly according to claim 1, wherein a mean direction of the crystalline planes of the second layer belonging to the family of planes {100} is inclined at a second angle smaller than 30° relative to a normal to the second face.

18. The functional micromechanical timepiece assembly according to claim 17, wherein the second angle is smaller than 10°.

* * * * *